(12) United States Patent
Kim et al.

(10) Patent No.: US 9,105,378 B2
(45) Date of Patent: Aug. 11, 2015

(54) GRAPHENE TRANSPARENT ELECTRODE AND METHOD FOR MANUFACTURING THE SAME

(71) Applicant: SAMSUNG ELECTRO-MECHANICS CO., LTD., Gyunggi-do (KR)

(72) Inventors: Woon Chun Kim, Gyunggi-do (KR); Kang Heon Hur, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 233 days.

(21) Appl. No.: 13/656,854

(22) Filed: Oct. 22, 2012

(65) Prior Publication Data

US 2013/0133925 A1 May 30, 2013

(30) Foreign Application Priority Data

Oct. 24, 2011 (KR) .......................... 10-2011-0108865

(51) Int. Cl.
*H01L 21/30* (2006.01)
*H01B 13/34* (2006.01)
*H01B 1/24* (2006.01)
*H01B 1/04* (2006.01)
*H01L 31/0224* (2006.01)
*H01L 31/18* (2006.01)
(Continued)

(52) U.S. Cl.
CPC ................. *H01B 13/34* (2013.01); *H01B 1/04* (2013.01); *H01B 1/24* (2013.01); *H01L 31/022466* (2013.01); *H01L 31/1884* (2013.01); *B82Y 30/00* (2013.01); *B82Y 40/00* (2013.01); *H01M 4/1393* (2013.01); *H01M 4/96* (2013.01); *Y02E 10/50* (2013.01)

(58) Field of Classification Search
CPC ............. H01B 13/34; H01B 1/24; H01B 1/04
USPC ........................................................ 438/455
See application file for complete search history.

(56) References Cited

U.S. PATENT DOCUMENTS

| | | | |
|---|---|---|---|
| 2010/0021708 A1* | 1/2010 | Kong et al. | 428/220 |
| 2011/0143101 A1* | 6/2011 | Sandhu | 428/195.1 |

(Continued)

FOREIGN PATENT DOCUMENTS

| | | |
|---|---|---|
| KR | 100819458 | 3/2008 |
| KR | 10-2011-0016287 | 2/2011 |
| KR | 10-2011-0031864 A | 3/2011 |

OTHER PUBLICATIONS

Office action dated May 20, 2013 from corresponding Korean Patent Application No. 10-2011-0108865 and its English summary provided by the clients.

(Continued)

*Primary Examiner* — Trung Q Dang
(74) *Attorney, Agent, or Firm* — Ladas & Parry, LLP

(57) ABSTRACT

Disclosed herein are a method for manufacturing a graphene transparent electrode and a graphene transparent electrode manufactured by the method. The method includes: providing a graphene oxide solution: forming a metal thin film on a glass substrate; coating the graphene oxide solution on the metal thin film, followed by drying; primarily reducing the thus obtained graphene oxide by using a reducing agent, to obtain reduced graphene oxide; secondarily reducing the reduced graphene oxide by heat treatment under the inert atmosphere, to form a reduced layer; compressing a transparent film on the reduced layer; and etching the metal film by an etching solution. The method enables a graphene transparent electrode having economical feasibility and excellent electric conductivity to be manufactured.

12 Claims, 2 Drawing Sheets

(51) Int. Cl.
*B82Y 40/00* (2011.01)
*H01M 4/1393* (2010.01)
*H01M 4/96* (2006.01)
*B82Y 30/00* (2011.01)

(56) References Cited

U.S. PATENT DOCUMENTS

2012/0025259 A1* 2/2012 Van Mol et al. ............... 257/99
2012/0058397 A1* 3/2012 Zhamu et al. .............. 429/231.8
2012/0097230 A1* 4/2012 Lee et al. ...................... 136/255
2013/0156678 A1* 6/2013 Banerjee et al. .......... 423/445 R

OTHER PUBLICATIONS

"Hydrazine and thermal Reduction of Graphene Oxide: Reaction Mechanisms, Product Structures, and Reaction Design." J. Phys. Chem. C vol. 114, 2010, pp. 832-842.

* cited by examiner

GRAPHENE TRANSPARENT ELECTRODE AND METHOD FOR MANUFACTURING THE SAME

CROSS REFERENCE TO RELATED APPLICATION

This application claims the benefit of Korean Patent Application No. 10-2011-0108865, filed on Oct. 24, 2011, entitled "Graphene Transparent Electrode and Method for Manufacturing the Same", which is hereby incorporated by reference in its entirety into this application.

BACKGROUND OF THE INVENTION

1. Technical Field

The present invention relates to a graphene transparent electrode and a method for manufacturing the same.

2. Description of the Related Art

In general, graphite has a structure in which flat second dimensional graphene sheets each composed of carbon atoms linked in hexagonal shapes are stacked. Recently, it was found that one or several layers of graphene sheets peeled off from the graphite have very useful properties different from those of the existing materials, as the result of researching characteristics of the sheets.

The most notable property is that electrons flow in the graphene sheet as if the mass of the electron is zero, and this means that the electrons flow at a speed at which light moves in a vacuum, that is, at the speed of light. In addition, the graphene sheet exhibits an abnormal half-integer quantum hall effect with respect to electrons and holes.

Meanwhile, the existing silicon based semiconductor process techniques make it impossible to manufacture semiconductor devices having high integration density of 30 nm or less. The reason is that, in a case where a metal atom layer of gold or aluminum deposited on a substrate has a thickness of 30 nm or less, metal atoms are not thermodynamically stable, so that they adhere and stick together, thereby failing to obtain a uniform thin film, and the concentration of impurities doped in silicon is not uniform in the nano-sized thin film. However, the graphene has a chance to overcome the limitation in the integration degree of this silicon-based semiconductor device technique.

The graphene has metallic properties and the thickness thereof is very small, which has several nanometers or less corresponding to a screening length. Therefore, in the graphene, a charge density is changed depending on gate voltage, resulting in changing electric resistance. Accordingly, a metal transistor may be embodied by using the above properties, and a high-speed electronic device may be embodied by using high mobility of a charge transporter. Further, the graphene is expected to be applied in various fields because charges of the charge transporter are changeable from electrons to holes depending on the polarity of the gate voltage.

A plurality of methods or processes for producing the graphene having these performances per se have been disclosed in Korean Patent Registration No. 10-0819458 and the like. In addition, Korean Laid-Open No. 10-2011-0016287 discloses a coating method of graphene oxide, according to which a colloidal graphene oxide solution is coated on a surface of a substrate, followed by drying and then heat treatment, and thus, the graphene oxide is converted to a graphene thin film, and this method has an effect that the graphene is directly coated on the surface of the substrate.

However, the graphene thin films disclosed in the patents are formed by complicated processes, and they are economically disadvantageous and exhibit low electric conductivity.

SUMMARY OF THE INVENTION

The present inventors confirmed that a transparent electrode, which is formed by coating a graphene oxide solution having excellent dispersibility on a metal thin film formed on a glass substrate, performing primary reduction with a reducing agent and secondary reduction by high-temperature heat treatment on the thus obtained graphene oxide to obtain graphene, compressing a transparent film on the graphene, and removing the metal thin film, exhibits excellent electric conductivity, and based on this, the present inventors completed the present invention.

Therefore, the present invention has been made in an effort to provide a method for manufacturing a graphene transparent electrode having excellent electric conductivity.

Also, the present invention has been made in an effort to provide a graphene transparent electrode manufactured by the method.

According to one preferred embodiment of the present invention, there is provided a method for manufacturing a graphene transparent electrode, including: providing a graphene oxide solution: forming a metal thin film on a glass substrate; coating the graphene oxide solution on the metal thin film, followed by drying; primarily reducing the thus obtained graphene oxide by using a reducing agent, to obtain reduced graphene oxide; secondarily reducing the reduced graphene oxide by heat treatment under the inert atmosphere, to form a reduced layer; compressing a transparent film on the reduced layer; and etching the metal film by an etching solution.

The metal may be copper, aluminum, nickel, iron, or zinc.

The metal thin film may have a thickness of 10 µm or less.

A surface of the glass substrate may be subjected to hydrophilic treatment by using a mixture of $H_2SO_4$ and $H_2O_2$.

The graphene oxide solution may contain metal nanowires or metal nano-particles.

The coating of the graphene oxide solution may be performed by any one method selected from spray coating, dip coating, spin coating, screen coating, offset coating, inkjet printing, pad printing, knife coating, kiss coating, gravure coating, brushing, ultrasonic fine spray coating, and spray-mist spray coating.

The reducing agent may be a gas or liquid phase of HI or $NH_2NH_2$.

The inert gas may be nitrogen or argon.

The heat treatment may be performed at a temperature of 100 to 1,000° C.

The graphene oxide solution may be an aqueous dispersion or an organic dispersion.

A material for the transparent film may be polyethylene terephthalate, polyacrylate, or polycarbonate.

The etching solution may be $FeCl_3$ or $HNO_3$.

According to another preferred embodiment of the present invention, there is provided a graphene transparent electrode having conductivity of 1 k$\Omega$/cm$^2$ or less, which is manufactured according to any method as described above.

The graphene transparent electrode may be used in a next generation electrode, a transparent conductive film, a solar cell, a heat radiant plate, an electromagnetic wave shielding agent, an antistatic coating, or a sensor.

DESCRIPTION OF THE PREFERRED EMBODIMENTS

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention. Therefore, the configurations described in the embodiments of the present invention are merely preferred embodiments but do not represent all of the technical spirit of the present invention. Thus, the present invention should be construed as including all the changes, equivalents, and substitutions included in the spirit and scope of the present invention at the time of filing this application.

Hereinafter, preferred embodiments of the present invention will be described in detail with reference to the accompanying drawings so that they can be easily practiced by those skilled in the art to which the present invention pertains.

Figure 1:
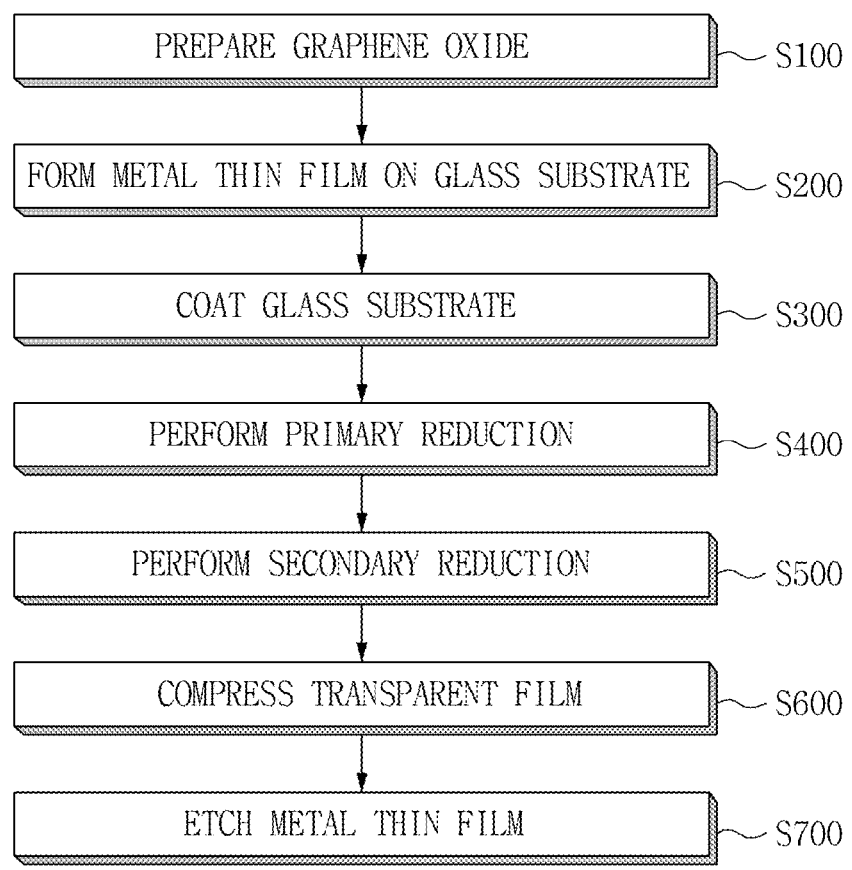
FIG. 1 is a block diagram schematically showing a process for manufacturing a graphene transparent electrode according to the present invention.
Figure 2:
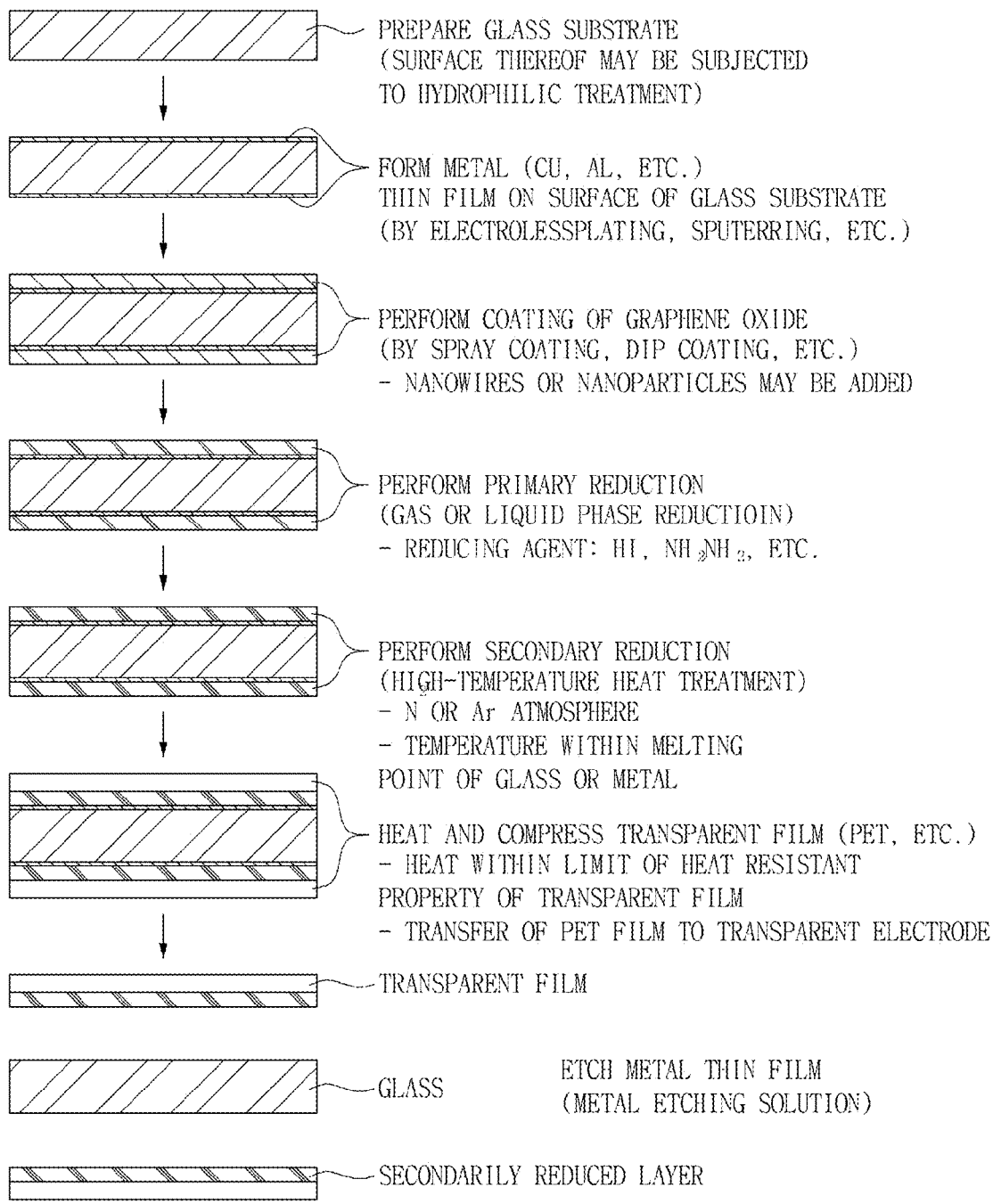
FIG. 2 is a flow chart schematically showing a process for manufacturing a graphene transparent electrode according to a preferred embodiment of the present invention.

FIG. 1 is a block diagram schematically showing a process for manufacturing a graphene transparent electrode according to the present invention; and FIG. 2 is a flow chart schematically showing a process for manufacturing a graphene transparent electrode according to a preferred embodiment of the present invention.

Referring to FIG. 1, first, graphene oxide is prepared (S100). In other words, a liquid phase of graphene oxide solution is prepared by using, for example, pre-graphene or mechanically pulverized graphene (GP). The thus prepared graphene oxide solution is an insulator, and is colored reddish brown or yellowish brown. Various methods for preparing the graphene oxide solution is known to those skilled in the art, and a graphene oxide solution prepared by any one of all the known methods may be used for the present invention.

For example, the pre-graphene or mechanically pulverized graphene and $NaNO_3$ are put into a $H_2SO_4$ solution, and $KMnO_4$ (or potassium chlorate) is slowly added thereinto while cooling the mixture. Then, $H_2SO_4$ is slowly added thereinto, and $H_2O_2$ is added thereinto. After that, centrifugal separation is performed, followed by removal of supernatant liquid, washing with $H_2SO_4/H_2O_2$, and finally washing with water. These procedures are repetitively performed to obtain a thick reddish brown graphene oxide solution (having a little gel type). Here, $Mn^{3+}$, $Mn^{4+}$, $MnO_2$, $KMnO_4$, $HNO_3$, $HNO_4$, $CrO_3$ or the like may be used as a chemical oxidant.

The graphene oxide solution may further include metal nano-wires or metal nano-particles in order to improve conductivity of the final transparent electrode, and the metal may include silver, copper, gold, and the like. It is preferable to add the metal nano-wires or metal nano-particles in a content of 50 wt % or less based on the complete graphene oxide solution, in view of transparency and coat-ability.

Meanwhile, a metal thin film is formed on a surface of a glass substrate, separately from preparation of the graphene oxide solution (S200). Here, metal thin films may be formed on both surfaces of the glass substrate. Here, as shown in FIG. 2, the glass substrate may be subjected to hydrophilic treatment as a pretreatment while a surface of the glass substrate is cleaned in advance.

The metal thin film may be formed on the glass substrate by electroless plating, sputtering, or the like, and the metal is preferably copper, aluminum, nickel, iron, zinc, or the like, but not limited thereto. In addition, since the metal thin film is to be removed by an etching solution during a subsequent process, the metal thin film is preferably formed as thinly as possible. However, the metal thin film needs to have durability in a graphene oxide coating procedure, a primary reduction procedure, and a secondary reduction procedure, and thus, a thickness thereof is 10 μm or less, and specifically 0.1 to 10 μm.

Then, the graphene oxide solution is coated on the metal thin film (S300), and then the coated graphene oxide solution is dried (not shown).

Also, when the graphene oxide solution is coated on one surface or both surfaces of the metal thin film to form graphene oxide, a diluting solvent (a dispersed liquid) may be added in order to regulate concentration of the graphene oxide solution and the like. In particular, since the concentration of the graphene oxide solution is regulated depending on the coating method of the graphene oxide solution, a diluting solvent may be further added to the final solution. Here, the diluting solvent may be water or an organic solvent, and it is preferable to use a mixture of one or more selected from acetone, methylethyl ketone, methyl alcohol, ethyl alcohol, isopropyl alcohol, butyl alcohol, ethylene glycol, polyethylene glycol, tetrahydrofuran, dimethyl formamide, dimethylacetamide, N-methyl-2-pyrrolidone, hexane, cyclohexanon, toluene, chloroform, distilled water, dichlororbenzene, dimethylbenzene, tremethylbenzene, pyridine, methylnaphthalene, nitromethane, acrylonitrile, octadecylamine, aniline, dimethylsulfoxide, methylene chloride, as the organic solvent.

In addition, the coating method of the graphene oxide solution may be any one method selected from spray coating, dip coating, spin coating, screen coating, offset coating, ink-jet printing, pad printing, knife coating, kiss coating, gravure coating, brushing, ultrasonic fine spray coating, and spray-mist spray coating.

According to the present invention, after the drying of the graphene oxide solution, the thus obtained graphene oxide is primarily reduced by immersing the resultant glass substrate in a liquid phase of HI or $NH_2NH_2$, but preferably HI, as a reducing agent, and supplying a gas phase of HI or $NH_2NH_2$, but preferably HI, to the dried glass substrate, thereby obtaining a reduced graphene oxide (rGO) (S400).

In this step, the graphene oxide can be reduced without damaging a chemical structure (a benzene ring) of the graphene oxide as much as possible by treating the graphene oxide by only the reducing agent.

Then, the reduced graphene oxide is secondarily reduced by heat treatment at 100 to 1,000° C. under the atmosphere of inert gas such as nitrogen or argon (S500). As such, when heat treatment is performed on the primarily reduced graphene oxide at a high temperature, the non-reduced graphene oxide is reduced to structurally form a benzene ring, resulting in improvement of electric conductivity. As the graphene oxide is more and more reduced to graphene, the color is changed to a darker color, close to black. The procedures including the secondary reduction result in a graphene thin film on a surface of the glass substrate. This graphene thin film retains high heat radiating property and electric conductivity, which are properties of graphene.

A transparent film is compressed and transferred on this graphene having high heat radiating property and electric conductivity (S600). The metal thin film is etched by using an etching solution to remove the metal thin film, with the result that a graphene transparent electrode is separated from the glass substrate (S700). In this step, if the above-described processes are performed on the two metal thin films formed on both surfaces of the glass substrate, two graphene transparent electrodes are separated from the glass substrate.

A preferred embodiment of the present invention will be described with reference to FIG. 2. First, a glass substrate is washed with $H_2SO_4/H_2O_2$, to modify a surface of the glass substrate in a hydrophilic state. Then, a thick metal thin film is formed at a thickness of about 1 μm on the glass substrate by electroless plating, sputtering, or the like. Then, the graphene oxide solution containing metal nano-wires or metal nano-particles is coated on the metal thin film at a thickness of 1 to 30 nm, preferably 10 to 20 nm by a spray coating method or a dip coating method. This coated glass substrate is dried at 70 to 90° C. (without being limited thereto), and then immersed in a liquid phase of hydrogen iodide (HI) and thereby to primarily reduce the graphene oxide. Then, the primarily reduced graphene oxide is secondarily reduced by heat treatment at a high temperature under the nitrogen atmosphere.

In general, when the graphene oxide (GO) is thermally reduced in the air to prepare graphene (GP), in a case where the heat treatment is performed on a thin film, the temperature for heat treatment is 300 to 400° C. In a case where the heat treatment is performed for a shot time, the heat treatment is possible even at a high temperature of 400 to 600° C. Meanwhile, when the heat treatment is performed at a low temperature of 300° C. or for example, about 170° C. or higher, for a long time, a significant amount of graphene oxide can be reduced to graphene.

However, in the present invention, the heat treatment is performed at temperatures from 100° C. to the melting point of glass, preferably at a high temperature of 100 to 1,000° C. under the atmosphere of inert gas such as nitrogen or argon, in order to improve quality of a coating film (improvement in electric conductivity), thereby manufacturing a transparent electrode of the present invention, which has electric conductivity of 1 kΩ/$cm^2$ or less, preferably 500Ω/$cm^2$ or less, and more preferably 200Ω/$cm^2$ or less. Here, if the temperature for the heat treatment is below 100° C., the graphene is not sufficiently reduced.

According to the present invention, a transparent film as a base is compressed and transferred on the reduced layer thus secondarily reduced. The transparent film may be made of polyethylene terephthalate, polyacrylate, polycarbonate, or the like, but is not particularly limited thereto. It is preferable to perform the compressing, in consideration of an adhesive strength between the transparent film and the reduced layer, the limit in a heat resistant property of the transparent film, or the like.

Then, the metal thin film is etched by using a general metal etching solution such as $FeCl_3$, $HNO_3$, or the like, to remove the metal thin film, with the result that two graphene transparent electrodes and the glass substrate. This etching process may be performed by using the technique known to those skilled in the art, but is not particularly limited thereto.

In the present invention, electric conductivity of the graphene transparent electrode depends on the thickness of the coated graphene, but as the graphene oxide (GO) coating becomes more reduced, electric conductivity thereof is further improved. This transparent electrode can be applied to electronic products related to electric conductivity property, such as a next generation electrode, a transparent conductive film, a solar cell, a heat radiant plate, an electromagnetic wave shielding agent, an antistatic coating, a sensor, and the like.

As described above, the graphene transparent electrode according to the present invention has an effect that electric conductivity is improved by the primary reduction and the secondary reduction. Further, the present invention is economically advantageous in that the glass substrate can be recycled and the transparent electrode can be manufactured by using the metal thin film in the minimum amount. Therefore, the present invention can be applied to electronic products requesting high electric conductivity, such as a next generation electrode, a transparent conductive film, a solar cell, a heat radiant plate, an electromagnetic wave shielding agent, an antistatic coating, a sensor, and the like.

What is claimed is:

1. A method for manufacturing a graphene transparent electrode, comprising:
   providing a graphene oxide solution:
   forming a metal thin film on a glass substrate;
   coating the graphene oxide solution on the metal thin film, followed by drying;
   primarily reducing the obtained graphene oxide by using a reducing agent, to obtain reduced graphene oxide;
   secondarily reducing the reduced graphene oxide by heat treatment under the inert atmosphere, to form a reduced layer;
   compressing a transparent film on the reduced layer formed on the metal thin film; and
   separating the compressed transparent film and the reduced layer from the glass substrate by etching the metal thin film by an etching solution.

2. The method as set forth in claim 1, wherein the metal is copper, aluminum, nickel, iron, or zinc.

3. The method as set forth in claim 1, wherein the metal thin film has a thickness of 10 μm or less.

4. The method as set forth in claim 1, wherein a surface of the glass substrate is subjected to hydrophilic treatment by using a mixture of $H_2SO_4$ and $H_2O_2$.

5. The method as set forth in claim 1, wherein the graphene oxide solution contains metal nano-wires or metal nano-particles in a content of 50 wt % or less based on the complete graphene oxide solution.

6. The method as set forth in claim 1, wherein the coating of the graphene oxide solution is performed by any one method selected from spray coating, dip coating, spin coating, screen coating, offset coating, inkjet printing, pad printing, knife coating, kiss coating, gravure coating, brushing, ultrasonic fine spray coating, and spray-mist spray coating.

7. The method as set forth in claim 1, wherein the reducing agent is a gas or liquid phase of HI or $NH_2NH_2$.

8. The method as set forth in claim 1, wherein the inert gas is nitrogen or argon.

9. The method as set forth in claim 1, wherein the heat treatment is performed at a temperature of 100 to 1,000° C.

10. The method as set forth in claim 1, wherein the graphene oxide solution is an aqueous dispersion or an organic dispersion.

11. The method as set forth in claim 1, wherein a material for the transparent film is polyethylene terephthalate, polyacrylate, or polycarbonate.

12. The method as set forth in claim 1, wherein the etching solution is $FeCl_3$ or $HNO_3$.

* * * * *